United States Patent
Aoki et al.

(10) Patent No.: US 6,864,729 B2
(45) Date of Patent: Mar. 8, 2005

(54) MODE SWITCHING METHOD FOR PLL CIRCUIT AND MODE CONTROL CIRCUIT FOR PLL CIRCUIT

(75) Inventors: Koju Aoki, Kasugai (JP); Hiroyuki Sakima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/084,974

(22) Filed: Mar. 1, 2002

(65) Prior Publication Data
US 2002/0140470 A1 Oct. 3, 2002

(30) Foreign Application Priority Data
Mar. 27, 2001 (JP) ........................................ 2001-089880

(51) Int. Cl.[7] .............................................. H03L 7/06
(52) U.S. Cl. ................................. 327/157; 331/DIG. 2
(58) Field of Search ................................ 327/155–159, 327/161–163, 146–150; 331/17, 25, DIG. 2; 375/373–376

(56) References Cited

U.S. PATENT DOCUMENTS

| | | | | |
|---|---|---|---|---|
| 5,164,685 A | | 11/1992 | Niemiö | 331/8 |
| 5,307,028 A | * | 4/1994 | Chen | 327/157 |
| 5,783,972 A | * | 7/1998 | Nishikawa | 327/157 |
| 5,831,483 A | * | 11/1998 | Fukuda | 331/17 |
| 6,067,335 A | | 5/2000 | Yamanoi et al. | 375/374 |
| 6,097,227 A | * | 8/2000 | Hayashi | 327/149 |
| 6,218,875 B1 | | 4/2001 | Mizokuchi | 327/156 |
| 6,226,339 B1 | * | 5/2001 | Nam et al. | 327/157 |
| 6,265,947 B1 | * | 7/2001 | Klemmer et al. | 331/17 |
| 6,518,845 B2 | * | 2/2003 | Nakamichi | 331/16 |
| 6,525,612 B2 | * | 2/2003 | Aoki | 331/11 |
| 6,549,079 B1 | * | 4/2003 | Crook | 331/17 |
| 6,624,675 B2 | * | 9/2003 | Neron | 327/157 |

FOREIGN PATENT DOCUMENTS

| | | |
|---|---|---|
| JP | 11-298323 | 10/1999 |
| WO | WO 9629785 | 9/1996 |

OTHER PUBLICATIONS

Taiwan Office Action Dated Jan. 16, 2003 with English Translation.
European Search Report of Jul. 15, 2003.

* cited by examiner

Primary Examiner—My-Trang Nu Ton
(74) Attorney, Agent, or Firm—Arent Fox PLLC

(57) ABSTRACT

A method of switching the mode of a PLL circuit which has a high-speed mode and a normal mode, which allows the PLL circuit to be locked up at a high speed. The PLL circuit includes a phase comparator and a charge pump for generating a current depending on a comparison output signal from the phase comparator. The mode switching method includes the steps of detecting whether a current output terminal of the charge pump is in a high impedance state, and switching the mode of the PLL circuit from the high-speed mode to the normal mode or from the normal mode to the high-speed mode when the high impedance state is detected.

18 Claims, 10 Drawing Sheets

Solid-line Curve : Locked Waveform According to Present Embodiment

Dot-and-dash-line Curve : Locked Waveform in Conventional Circuit

MODE SWITCHING METHOD FOR PLL CIRCUIT AND MODE CONTROL CIRCUIT FOR PLL CIRCUIT

BACKGROUND OF THE INVENTION

The present invention relates to a mode switching method for a PLL circuit and a mode control circuit for a PLL circuit, and more particularly to a mode switching method for a PLL circuit and a mode control circuit for a PLL circuit having two modes, i.e., a high-speed mode and a normal mode.

In recent years, PLL circuits are used in PLL frequency synthesizers for mobile communications, e.g., cellular phone systems. There are a strict requirement for high-speed lock-up of PLL circuits and a strict requirement for high C/N ratios (carrier-to-noise ratios) and low-spurious leakage while PLL circuits are being locked. To meet these two contradicting requirements, a process for switching between a high-speed mode and a normal mode has been proposed. In the high-speed mode, the loop gain is high, and the PLL circuit is locked up at a high speed. In the normal mode, the loop gain is low, and a high C/N ratio and low spurious characteristics are obtained.

FIG. 1 of the accompanying drawings shows in block form a conventional PLL frequency synthesizer.

As shown in FIG. 1, a PLL circuit 80 has a phase comparator 84 which receives a reference frequency-divided signal LDR from a reference counter 82 and a comparison frequency-divided signal LDP from a main counter 83. The phase comparator 84 compares the phase of the reference frequency-divided signal LDR and the phase of the comparison frequency-divided signal LDP with each other, and generates an up pulse signal PU or a down pulse signal PD which has a pulse duration depending on the result of the comparison. A charge pump 85 receives the up pulse signal PU or the down pulse signal PD, and generates a current DO depending on the up pulse signal PU or the down pulse signal PD which has been received. The current DO is supplied through a low-pass filter (LPF) 86 to a VCO 87, whose oscillation frequency is controlled depending on the current DO.

When the reference frequency-divided signal LDR and the comparison frequency-divided signal LDP are in phase with each other, i.e., when the PLL circuit 80 is in a locked state, if the output current DO from the charge pump 85 is 0 (zero), then the system has a dead band. Therefore, the phase comparator 84 generates an up current and a down current. Since an output current flowing when the PLL circuit 80 is locked affects the C/N ratio and the spurious leakage, the output current is suppressed in the normal mode.

If the low-pass filter 86 of the PLL circuit 80 is fixed, then the lock-up time is shortened when the output current is large. Therefore, the output current DO of the charge pump 85 in the high-speed mode is set so as to be higher than in the normal mode, or to increase the pulse durations of the up pulse signal PU and the down pulse signal PD.

The normal mode and the high-speed mode are switched by a lock detecting circuit 89 which detects a locked state in accordance with the comparison output signal (the up pulse signal PU and the down pulse signal PD) from the phase comparator 84. The lock detecting circuit 89 generates a mode switching signal SW and supplies the mode switching signal SW to the charge pump 85. The lock detecting circuit 89 switches the normal mode and the high-speed mode in accordance with the locked state.

In the locked state, the frequency of the reference frequency-divided signal LDR and the frequency of the comparison frequency-divided signal LDP are the same as each other. When the phase difference between the signals LDR, LDP falls in a predetermined range, the lock detecting circuit 89 switches the high-speed mode to the normal mode.

The PLL circuit 80 with the low-pass filter 86 being fixed stably has the phase difference between the signals LDR, LDP due to the characteristics of the charge pump 85 and the low-pass filter 86. Therefore, the PLL circuit 80 is stable in different states in the high-speed mode and the normal mode. As a result, when the high-speed mode is switched to the normal mode, the PLL circuit 80 tends to be unlocked, increasing the phase difference between the reference frequency-divided signal LDR and the comparison frequency-divided signal LDP.

In such a case, the total lock-up time is the sum of the lock-up time in the high-speed mode and the re-lock-up time required to lock the PLL circuit from an unlocked state upon mode switching. In order to reduce the total lock-up time, therefore, it is necessary to reduce the re-lock-up time required due to the unlocked state.

However, after the lock detecting circuit 89 detects a locked state, the lock detecting circuit 89 generates a mode switching signal SW for changing from the high-speed mode to the normal mode. If the mode switching signal SW is supplied to the charge pump 85 while in operation, then the difference that is developed between the locked frequency and the unlocked frequency by the unlocking of the PLL circuit, i.e., the unlocked frequency interval, is widened.

If the unlocked interval is large, then the time required to reach a maximum unlocked frequency (maximum unlocked state reaching time) is increased when the PLL circuit is re-locked up, resulting in an increase in the re-lock-up time. As a result, the total lock-up time is increased.

SUMMARY OF THE INVENTION

It is an object of the present invention to provide a mode switching method for a PLL circuit and a mode control circuit for a PLL circuit for making it possible to lock up the PLL circuit, which operates in a high-speed mode and a normal mode, at a high speed.

To achieve the above object, the present invention provides a method of switching the mode of a PLL circuit. The PLL circuit includes a phase comparator for comparing the phase of a reference frequency-divided signal and the phase of a comparison frequency-divided signal with each other and generating a comparison output signal, a charge pump for generating a current depending on the comparison output signal from the phase comparator, and a voltage-controlled oscillator for generating an output signal having a predetermined frequency in accordance with the current generated by the charge pump. The PLL circuit has a first mode for locking an output signal thereof up to a desired frequency at a high speed and a second mode in normal use. The method includes detecting whether a current output terminal of the charge pump is in a high impedance state, and switching the mode of the PLL circuit from the first mode to the second mode or from the second mode to the first mode when the high impedance state is detected.

A further perspective of the present invention is a circuit for controlling the mode of a PLL circuit. The PLL circuit includes a phase comparator for comparing the phase of a reference frequency-divided signal and the phase of a comparison frequency-divided signal with each other and generating a comparison output signal, a charge pump connected to the phase comparator, for generating a current depending on the comparison output signal from the phase comparator, and a voltage-controlled oscillator connected to the charge pump, for generating an output signal having a predetermined frequency in accordance with the current generated by the charge pump. The PLL circuit has a first mode for locking an output signal thereof up to a desired frequency at a high speed and a second mode in normal use. The circuit includes a state detecting circuit for detecting whether a current output terminal of the charge pump is in a high impedance state. The state detecting circuit generates a mode switching signal to switch the mode of the PLL circuit from the first mode to the second mode or from the second mode to the first mode when the high impedance state is detected.

A further perspective of the present invention is a semiconductor device including a PLL circuit and a mode control circuit connected to the PLL circuit, for controlling switching of the mode of the PLL circuit. The PLL circuit includes a phase comparator for comparing the phase of a reference frequency-divided signal and the phase of a comparison frequency-divided signal with each other and generating a comparison output signal, a charge pump connected to the phase comparator, for generating a current depending on the result of the comparison by the phase comparator, and a voltage-controlled oscillator connected to the charge pump, for generating an output signal having a predetermined frequency in accordance with the current generated by the charge pump. The PLL circuit has a first mode for locking an output signal thereof up to a desired frequency at a high speed and a second mode in normal use. The mode control circuit detects whether a current output terminal of the charge pump is in a high impedance state, and generates a mode switching signal to switch the mode of the PLL circuit from the first mode to the second mode or from the second mode to the first mode when the high impedance state is detected.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
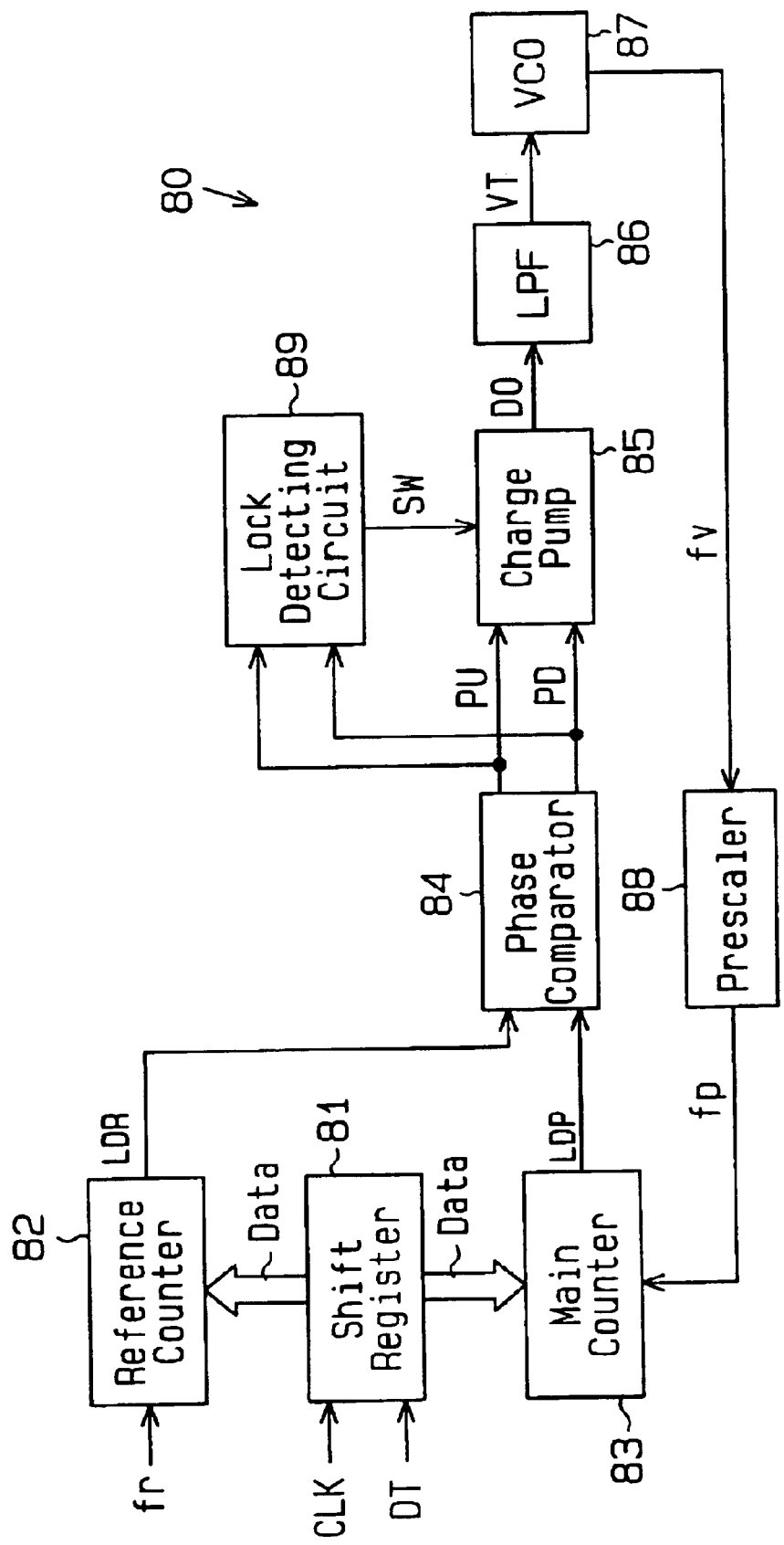
FIG. 1 is a schematic block diagram of a conventional PLL frequency synthesizer.

In the drawings, like numerals are used for like elements throughout.

[First Embodiment]

Figure 2:
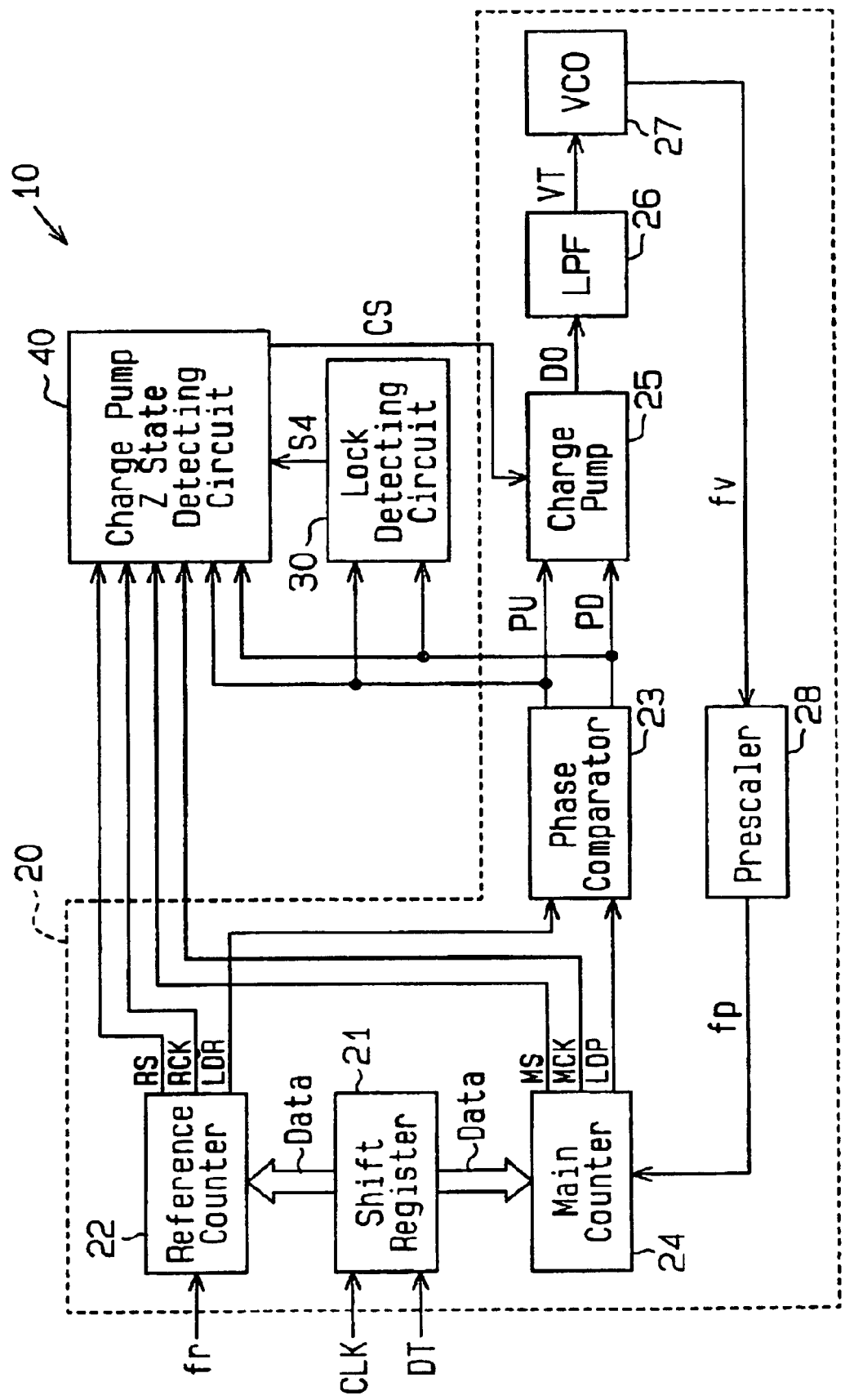
FIG. 2 is a schematic block diagram of a PLL frequency synthesizer according to a first embodiment of the present invention.

FIG. 2 shows a schematic block diagram of a PLL frequency synthesizer 10 according to a first embodiment of the present invention. The PLL frequency synthesizer 10 comprises a PLL circuit 20, a lock detecting circuit 30, and a charge-pump Z-state detecting circuit (hereinafter referred to as "state detecting circuit") 40.

The PLL circuit 20 has a function to switch between a high-speed mode (first mode) and a normal mode (second mode). In the high-speed, the loop gain is high, and the PLL circuit 20 is locked up at a high speed. In the normal mode, the loop gain is low, and a high C/N ratio and low spurious characteristics are obtained.

The lock detecting circuit 30 detects a locked state of the PLL circuit 20 in accordance with an up pulse signal PU (first pulse signal) and a down pulse signal PD (second pulse signal) from the PLL circuit 20. The lock detecting circuit 30 generates a lock detecting signal S4 based on the detected result.

The state detecting circuit 40 controls the lock detecting signal S4 in accordance with counter internal state signals RS, MS, counter clock signals RCK, MCK, and the pulse signals PU, PD from the PLL circuit 20, to generate a mode switching signal CS. The mode switching signal CS is supplied to the PLL circuit 20.

The PLL circuit 20 will be described in detail below. The PLL circuit 20 comprises a shift register 21, a reference counter (reference frequency divider) 22, a phase comparator 23, a main counter (comparison frequency divider) 24, a charge pump 25, a low-pass filter (hereinafter referred to as "LPF") 26, a voltage-controlled oscillator (hereinafter referred to as "VCO") 27, and a prescaler 28.

The shift register 21 receives a clock signal CLK from an external source and successively reads a serial signal DT in accordance with the clock signal CLK. The shift register 21 converts the serial signal DT that has been read into a parallel signal Data, and supplies the parallel signal Data to the reference counter 22 and the main counter 24.

The reference counter 22 receives a reference signal fr having a predetermined frequency which is generated by the oscillation of a quartz crystal unit, for example. The reference counter 22 divides the frequency of the reference signal fr in accordance with a reference frequency-dividing ratio, thereby generating a reference frequency-divided signal LDR. The reference frequency-dividing ratio is established depending on the parallel signal Data. The reference frequency-divided signal LDR is supplied to the phase comparator 23. The phase comparator 23 receives a comparison frequency-divided signal LDP from the main counter 24.

The phase comparator 23 compares the phases of the signals LDR, LDP, generates an up pulse signal PU and a down pulse signal PD (comparison output signals) which have pulse durations depending on the phase difference, and supplies the up pulse signal PU and the down pulse signal PD to the charge pump 25. The charge pump 25 generates a pump signal DO having a current value depending on the up pulse signal PU and the down pulse signal PD, and supplies the pump signal DO to the LPF 26.

The LPF 26 smoothes the pump signal DO to generate a control signal VT having a DC voltage free of high-frequency components. The control signal VT is supplied to the VCO 27. The VCO 27 generates a VCO signal fv having a frequency depending on the voltage value of the control signal VT, and supplies the VCO signal fv to the prescaler 28 and an external circuit (not shown).

The prescaler 28 frequency-divides the VCO signal fv in accordance with a fixed frequency-dividing ratio, generating a comparison signal fp, which is supplied to the main counter 24. The main counter 24 frequency-divides the comparison signal fp in accordance with a comparison frequency-dividing ratio, generating the comparison frequency-divided signal LDP. The comparison frequency-divided signal LDP is supplied to the phase comparator 23.

In the PLL circuit 20, when the frequency of the VCO signal fv becomes lower than a locked frequency, the frequency of the comparison signal fp becomes lower than the frequency signal of the reference signal fr, developing a phase difference between the signals fr, fp. The phase comparator 23 generates an up pulse signal PU and a down pulse signal PD which have pulse durations depending on the phase difference between the signals fr, fp. For example, a phase difference may cause the pulse duration of the up pulse signal PU to be longer than the pulse duration of the down pulse signal PD.

The charge pump 25 generates a pump signal DO depending on the pulse durations at a low level of the up pulse signal PU and the down pulse signal PD. During a period in which the up pulse signal PU and the down pulse signal PD are of high level, the charge pump 25 holds its output terminal at a high impedance state (Z state). The LPF 26 changes the voltage value of the control signal VT in accordance with the pump signal DO, generating a control signal VT having a high voltage value, for example. At this time, the VCO 27 generates a VCO signal fv having a high frequency depending on the control signal VT.

Conversely, when frequency of the VCO signal fv becomes higher than a desired frequency, the frequency of the comparison signal fp becomes higher than the frequency of the reference signal fr, developing a phase difference between the signals fr, fp. The phase comparator 23 generates an up pulse signal PU and a down pulse signal PD which have pulse durations depending on the phase difference between the signals fr, fp.

The charge pump 25 supplies a pump signal DO depending on the pulse durations at a low level of the up pulse signal PU and the down pulse signal PD. During a period in which the up pulse signal PU and the down pulse signal PD are of high level, the charge pump 25 holds its output terminal at a high impedance state (Z state). The LPF 26 generates a control signal VT having a low voltage value in accordance with the pump signal DO. At this time, the VCO 27 generates a VCO signal fv having a low frequency in accordance with the control signal VT.

The PLL circuit 20 repeatedly carries out the above operation to lock the frequency of the VCO signal fv to the frequency corresponding to the reference frequency-dividing ratio of the reference counter 22 and the comparison frequency-dividing ratio of the main counter 24.

The PLL circuit 20 switches between the high-speed mode and the normal mode in response to the mode switching signal CS. In the first embodiment, the charge pump 25 switches the modes. The charge pump 25 adjusts the amount of current of the pump signal DO depending on each of the modes, in response to the mode switching signal CS. Specifically, in response to the mode switching signal CS, the charge pump 25 makes the amount of the current of the pump signal DO greater in the high-speed mode than the amount of the current of the pump signal DO in the normal mode. In the high-speed mode, therefore, a change in the frequency of the VCO signal fv increases, causing the VCO signal fv to approach a desired frequency quickly. In the normal mode, a change in the frequency of the VCO signal fv decreases, stabilizing the frequency of the VCO signal fv.

The mode switching function may be performed by the phase comparator 23 or the LPF 26.

The lock detecting circuit 30 will be described below. The lock detecting circuit 30 includes a phase comparator (not shown), for example. The lock detecting circuit 30 receives the up pulse signal PU and the down pulse signal PD, and detects the phase difference between the signals PU, PD. The lock detecting circuit 30 generates a lock detecting signal S4 based on the detected result, and supplies the lock detecting signal S4 to the state detecting circuit 40.

The phase difference between rising edges of the pulse signals PU, PD varies with the frequency difference between the reference frequency-divided signal LDR and the comparison frequency-divided signal LDP. When the phase difference between the pulse signals PU, PD becomes equal to or smaller than a predetermined value, the lock detecting circuit 30 detects a locked state of the PLL circuit 20. When the phase difference between the pulse signals PU, PD becomes larger than the predetermined value, the lock detecting circuit 30 detects an unlocked state of the PLL circuit 20. The lock detecting circuit 30 according to the first embodiment generates a lock detecting signal S4 of high level when the phase difference between the pulse signals PU, PD is equal to or smaller than a predetermined value (locked state), and generates a lock detecting signal S4 of low level when the phase difference between the pulse signals PU, PD is greater than the predetermined value (unlocked state).

Figure 3:
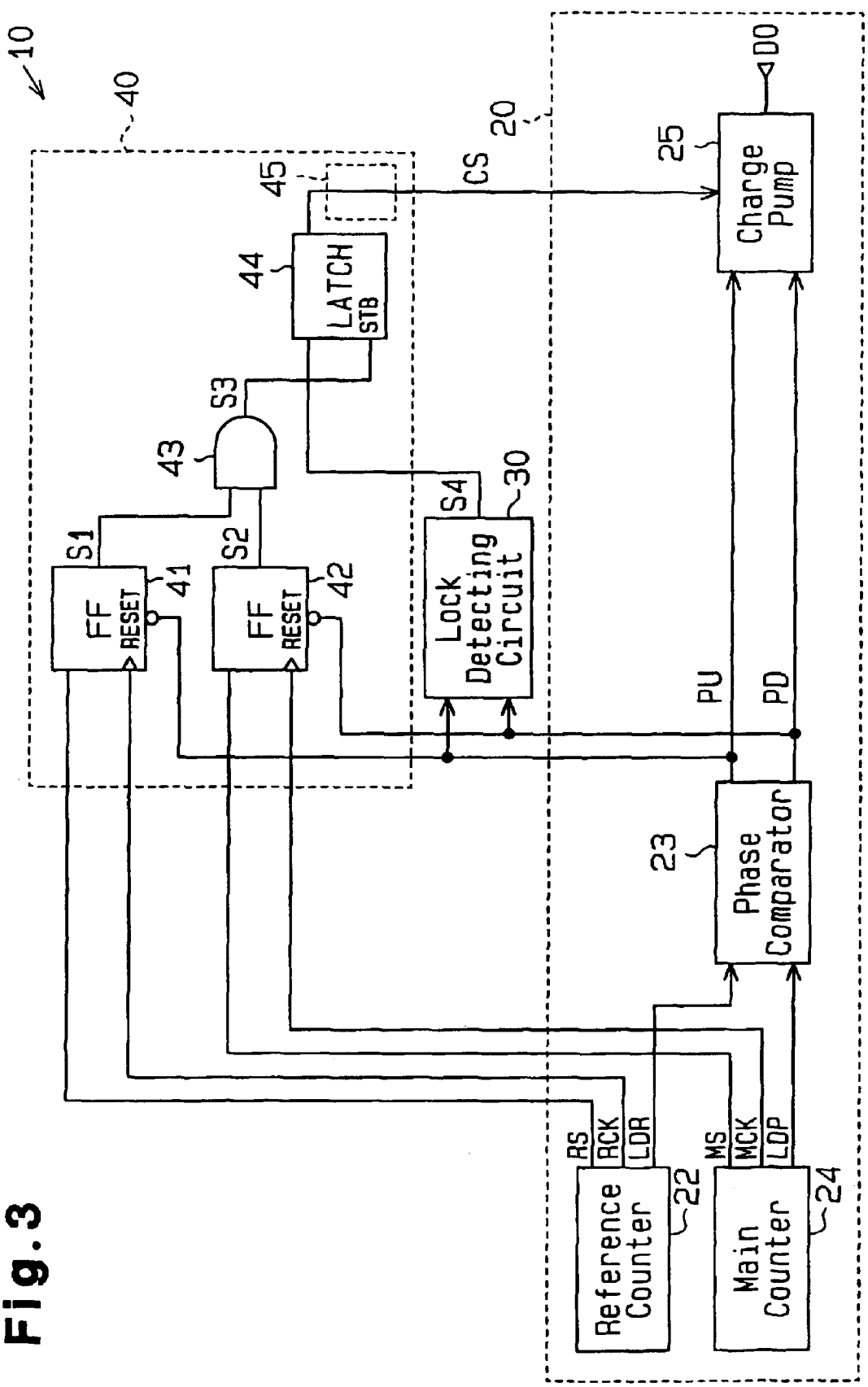
FIG. 3 is a schematic circuit diagram of a charge-pump Z-state detecting circuit of the PLL frequency synthesizer shown in FIG. 2.

The state detecting circuit 40 will be described below. As shown in FIG. 3, the state detecting circuit 40 comprises first and second flip-flops (hereinafter referred to as "FF") 41, 42, an AND circuit (AND) 43, and a latch circuit (LATCH) 44.

The first and second FFs 41, 42 comprise D flip-flops. The first FF 41 has a clock input terminal which receives the clock signal RCK from the reference counter 22, a data input terminal which receives the counter internal state signal RS from the reference counter 22, and a reset input terminal (RESET) which receives the up pulse signal PU.

The second FF 42 has a clock input terminal which receives the clock signal MCK from the main counter 24, a data input terminal which receives the counter internal state signal MS from the main counter 24, and a reset input terminal (RESET) which receives the down pulse signal PD.

The AND circuit 43 receives output signals S1, S2 from the first and second FFs 41, 42. The latch circuit 44 has a strobe input terminal (STB) which receives an output signal S3 from the AND circuit 43 and a data input terminal which receives the lock detecting signal S4 from the lock detecting circuit 30. The latch circuit 44 latches the lock detecting signal S4 in accordance with the output signal S3 from the AND circuit 43, and generates the mode switching signal CS. The state detecting circuit 40 supplies the mode switching signal CS to the charge pump 25.

When the lock detecting circuit 30 detects a locked state and generates a lock detecting signal S4 having a high level, the state detecting circuit 40 generates a mode switching signal CS for operating the PLL circuit 20 in the normal mode. When the lock detecting circuit 30 detects an unlocked state and generates a lock detecting signal S4 having a low level, the state detecting circuit 40 generates a mode switching signal CS for operating the PLL circuit 20 in the high-speed mode.

Figure 4A:
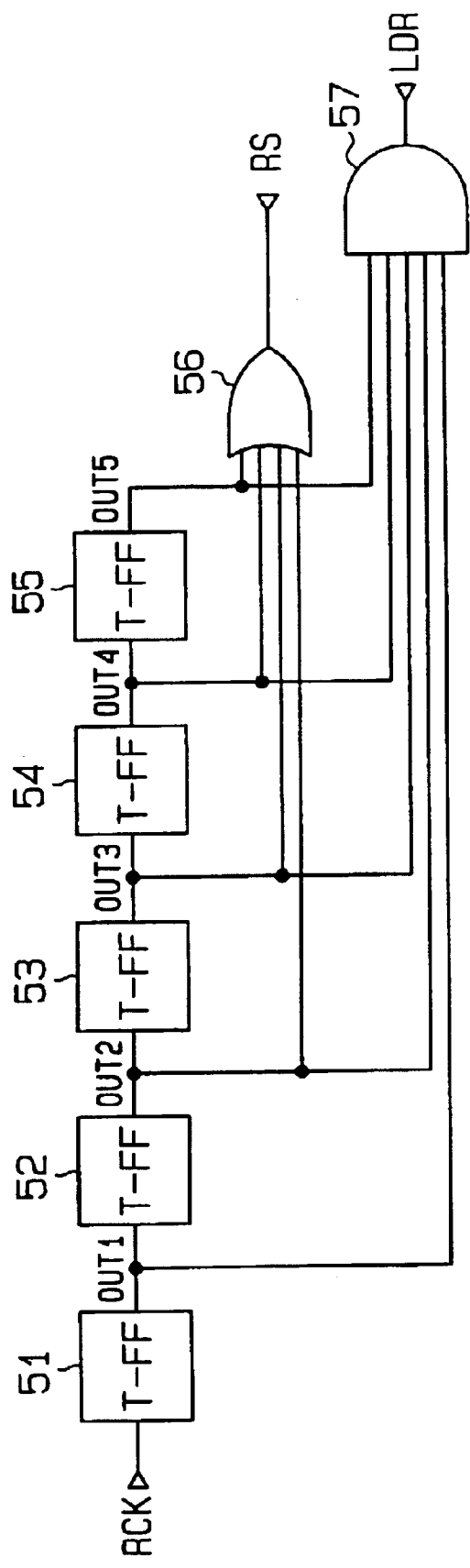
FIG. 4A is a schematic circuit diagram of a counter of the PLL frequency synthesizer shown in FIG. 2.
Figure 4B:
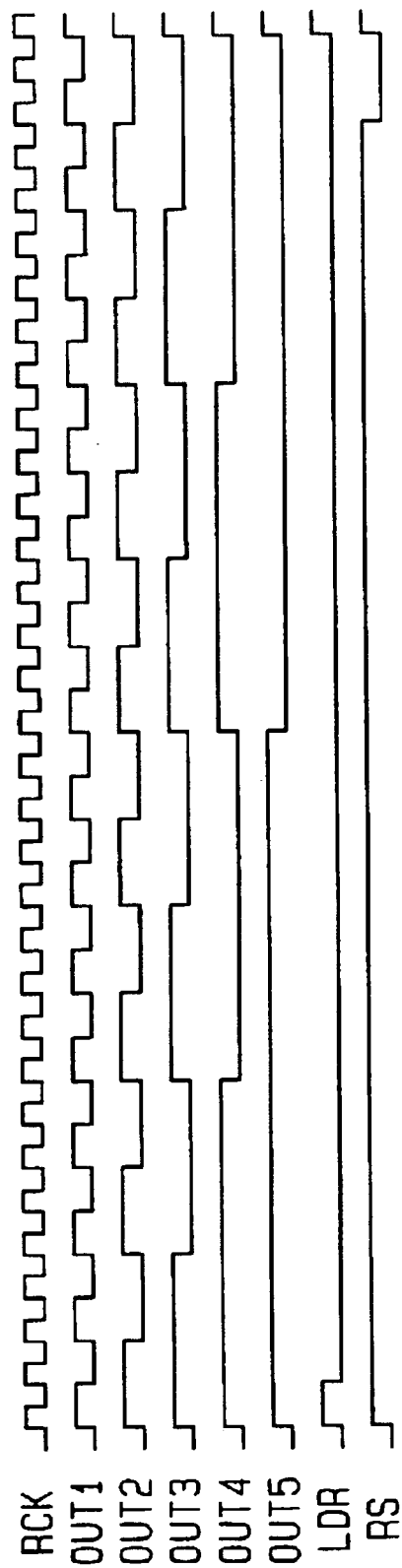
FIG. 4B is a diagram showing output waveforms of the counter shown in FIG. 4A.

FIG. 4A shows a schematic circuit diagram of the reference counter 22, and FIG. 4B shows output waveforms of the reference counter 22.

As shown in FIG. 4A, the reference counter 22 comprises first through fifth T flip-flops (hereinafter referred to as "TFF") 51 through 55, an OR circuit 56, and an AND circuit 57.

The reference counter 22 is a down counter including the five first through fifth TFFs 51 through 55, for example. The first TFF 51 receives the clock signal (counter input) RCK. The AND circuit 57 receives output signals OUT1 through OUT5 from the first through fifth TFFs 51 through 55, and generates the reference frequency-divided signal (counter output) LDR in accordance with the output signals OUT1 through OUT5.

The OR circuit 56 receives the output signals OUT2 through OUT5 from the second through fifth TFFs 52 through 55, and generates the internal state signal (counter internal output signal) RS in accordance with the output signals OUT2 through OUT5. As shown in FIG. 4B, the internal state signal RS changes to a low level two clock pulses of the clock signal RCK before the reference frequency-divided signal LDR goes high.

The main counter 24 includes a circuitry similar to the reference counter 22. The internal state signal MS of the main counter 24 also changes to a low level two clock pulses of the clock signal MCK before the comparison frequency-divided signal LDP goes high.

Figure 5:
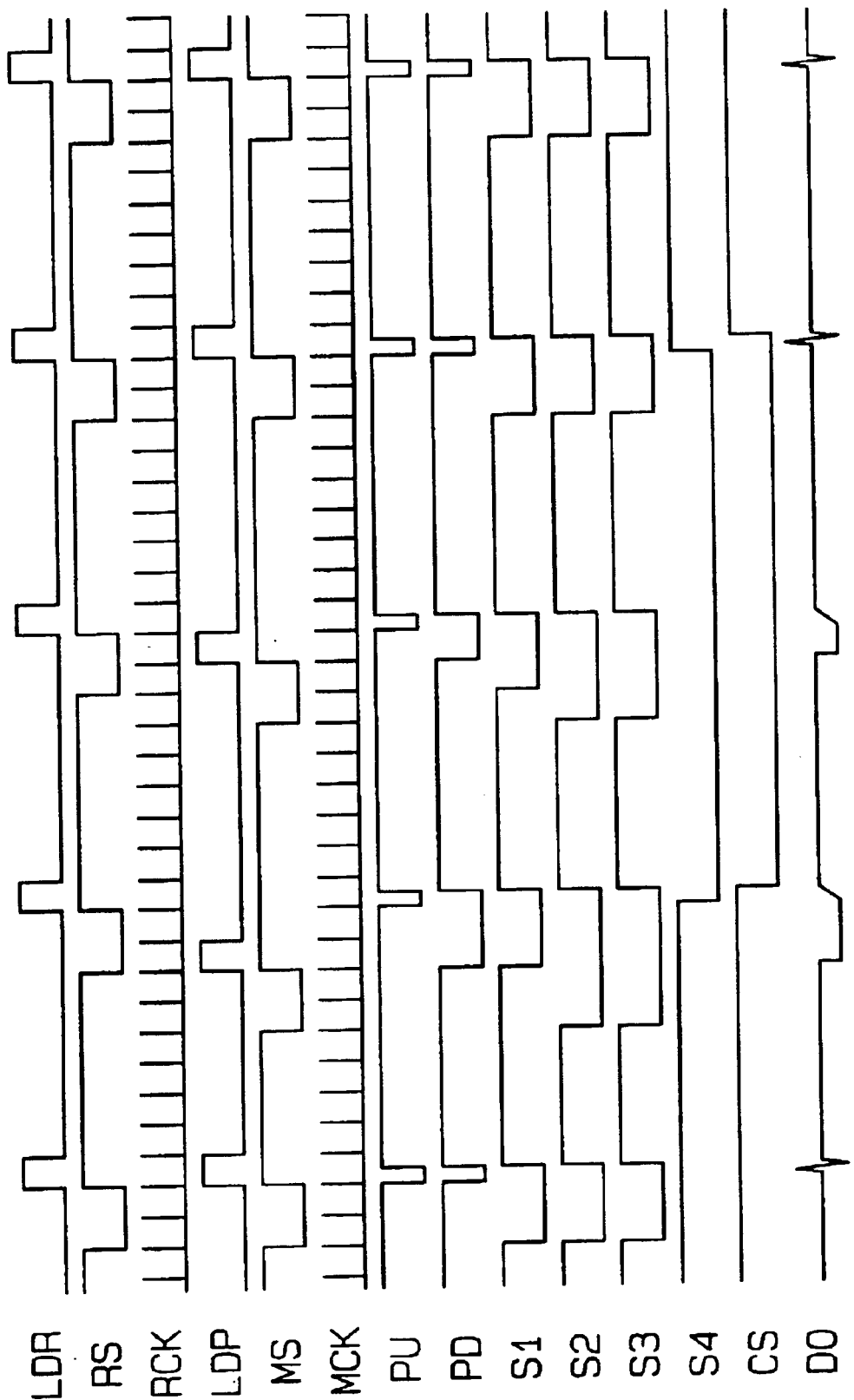
FIG. 5 is a timing chart of the PLL frequency synthesizer shown in FIG. 2.

As shown in FIG. 5, the first FF 41 generates a first FF signal S1 of low level from the time when the internal state signal RS goes low to the time when the up pulse signal PU goes high. The second FF 42 generates a second FF signal S2 of low level from the time when the internal state signal MS goes low to the time when the down pulse signal PD goes high.

Therefore, the AND circuit 43 receives the first and second FF signals S1, S2, and generates an AND signal S3 of low level while the charge pump 25 is operating in accordance with the pulse signals PU, PD. The AND circuit 43 generates an AND signal S3 of high level when the charge pump 25 is not operating (Z state).

The latch circuit 44 latches the lock detecting signal S4 in accordance with the AND signal S3, and generates a mode switching signal CS from the latched lock detecting signal S4.

The mode switching signal CS (mode switching timing) changes in synchronism with rising edges of the AND signal S3, as shown in FIG. 5.

The state detecting circuit 40 changes the level of the mode switching signal CS at the time the charge pump 25 is operating to the level thereof at the time the charge pump 25 is not operating (Z state).

Operation of the PLL frequency synthesizer 10 will be described below.

As shown in FIG. 5, when the PLL circuit 20 is first operating in the normal mode, the lock detecting circuit 30 generates a lock detecting signal S4 of high level (locked state). In accordance with the lock detecting signal S4 of high level, the state detecting circuit 40 supplies a mode switching signal CS of high level to the charge pump 25. In the normal mode, the amount of the current of the pump signal DO is suppressed. Therefore, a change in the frequency of the VCO signal fv is reduced, stabilizing the frequency of the VCO signal fv.

When the locked frequency is changed, the phase difference between the pulse signals PU, PD increases beyond a predetermined value, and the lock detecting circuit 30 generates a lock detecting signal S4 of low level (unlocked state).

The state detecting circuit 40 latches the lock detecting signal S4 in accordance with the AND signal S3 of low level. After having receiving the lock detecting signal S4 of low level (unlocked state) from the lock detecting circuit 30, the state detecting circuit 40 generates a mode switching signal CS of low level in synchronism with a rising edge of the AND signal S3. The PLL circuit 20 operates in the high-speed mode and locks up the VCO output signal at a high speed in response to the mode switching signal CS of low level.

The charge pump 25 generates a pump signal DO in accordance with the pump signals PU, PD of low level, and changes the output terminal thereof to the Z state in accordance with the pump signals PU, PD of high level. Therefore, the normal mode switches to the high-speed mode when the charge pump 25 is in the Z state.

Then, when the lock detecting circuit 30 generates a lock detecting signal S4 of high level again, the state detecting circuit 40 supplies a mode switching signal CS of high level to the charge pump 25 in the Z state. At this time, the PLL circuit 20 operates in the normal mode. Since the high-speed mode switches to the normal mode when the charge pump 25 is in the Z state, the unlocked frequency interval is reduced.

Figure 6:
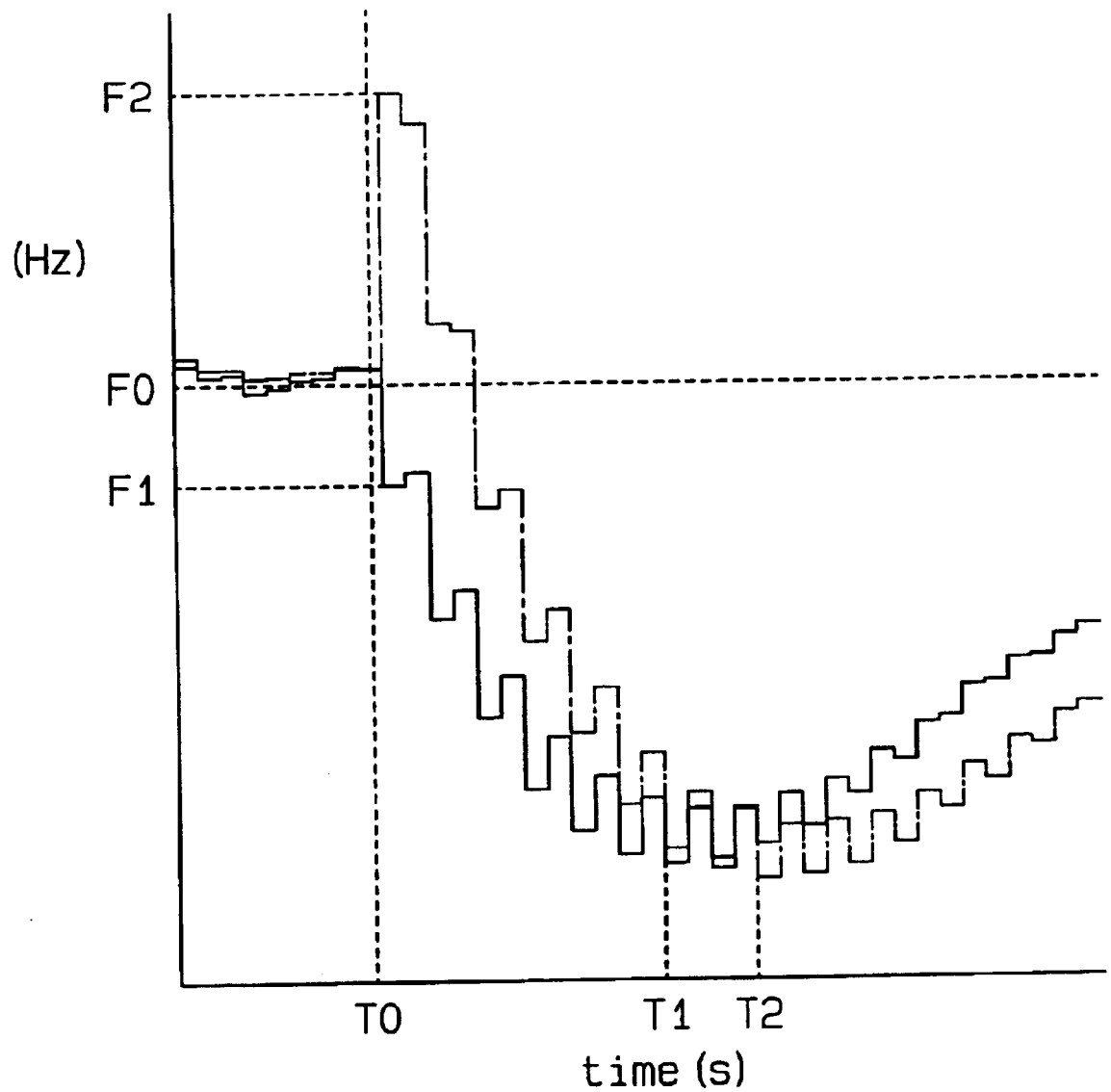
FIG. 6 is a waveform diagram showing mode switching from a high-speed mode to a normal mode of the PLL frequency synthesizer shown in FIG. 2.

FIG. 6 shows locked waveforms after the high-speed mode has switched to the normal mode. When the mode switches at a time T0 in FIG. 6, the unlocked frequency F1 due to phase comparison immediately after the mode switching is lower than the conventional unlocked frequency F2. In the first embodiment, the unlocked frequency interval is reduced because the mode switching is carried out when the charge pump 25 is in the Z state. Therefore, the maximum unlocked state reaching time T1 is shorter than the conventional maximum unlocked state reaching time T2. Consequently, the re-lock-up time is shortened by the difference (T2−T1) between these maximum unlocked state reaching times, and the total lock-up time is also shortened.

The PLL frequency synthesizer 10 according to the first embodiment offers the following advantage: the state detecting circuit 40 generates a mode switching signal CS when the charge pump 25 is in the Z state, switching the mode of the charge pump 25 from the high-speed mode to the normal mode. Therefore, the unlocked frequency interval is reduced, shortening the re-lock-up time. As a result, the total lock-up time is shortened.

[Second Embodiment]

Figure 7:
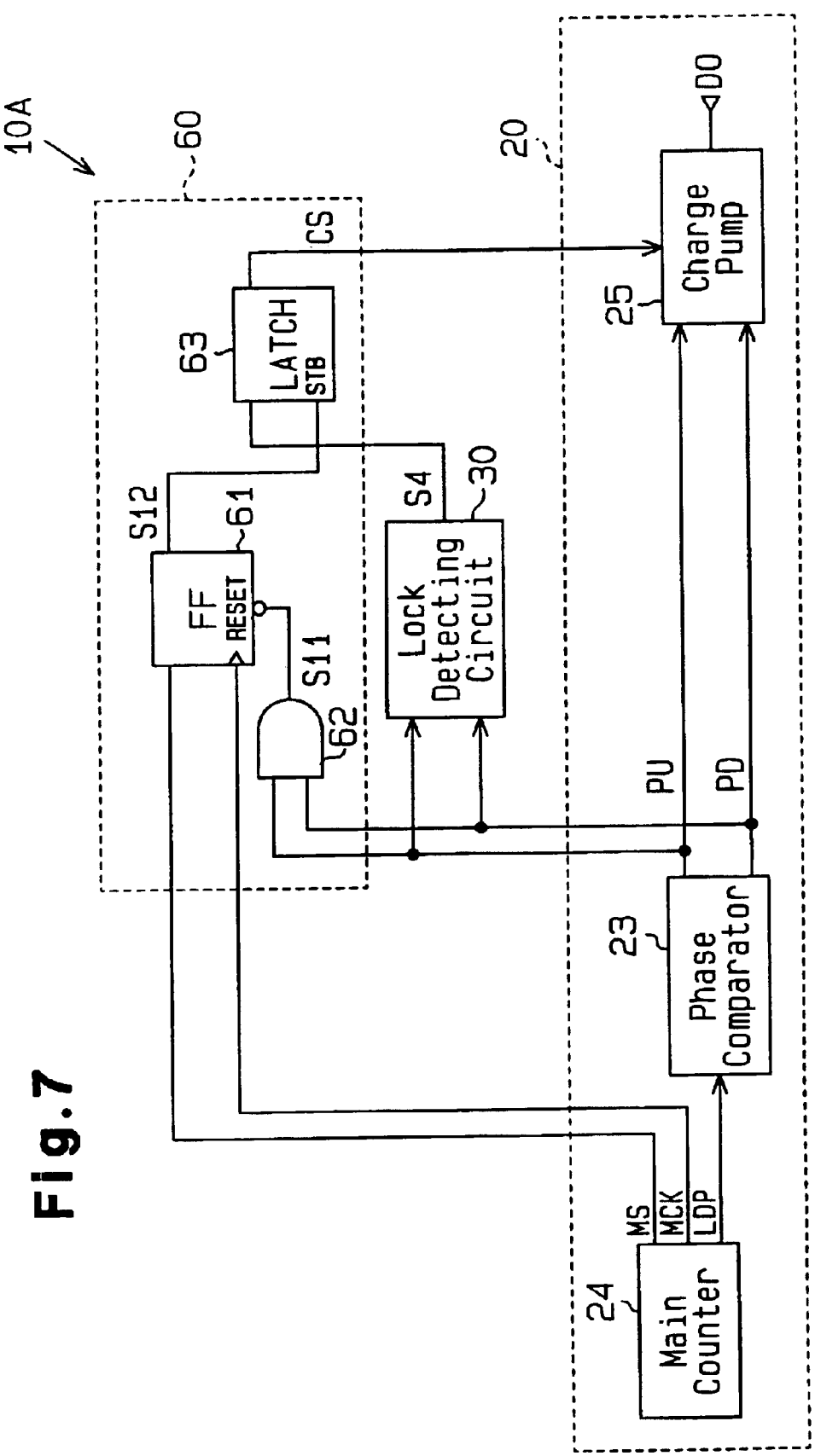
FIG. 7 is a schematic circuit diagram of a charge-pump Z-state detecting circuit of a PLL frequency synthesizer according to a second embodiment of the present invention.

FIG. 7 shows a schematic circuit diagram of a state detecting circuit 60 according to a second embodiment of the present invention. The state detecting circuit 60 comprises a flip-flop (FF) 61, an AND circuit 62, and a latch circuit 63. The AND circuit 62 receives an up pulse signal PU and a down pulse signal PD.

The FF 61 comprises a D flip-flop. The FF 61 has a clock input terminal which receives the clock signal MCK from the main counter 24, a data input terminal which receives the counter internal state signal MS from the main counter 24, and a reset input terminal which receives an output signal S11 from the AND circuit 62. Therefore, as shown in FIG.

8, the FF 61 generates an FF output signal S12 of low level from the time when the counter internal state signal MS goes low to the time when the AND output signal S11 goes high.

The latch circuit 63 has a data input terminal which receives the lock detecting signal S4 from the lock detecting circuit 30 and a strobe input terminal which receives the FF output signal S12. The latch circuit 63 latches the lock detecting signal S4 in accordance with the FF output signal S12, and generates a mode switching signal CS, which is supplied to the charge pump 25.

The state detecting circuit 60 controls the lock detecting signal S4 in accordance with the internal state signal MS and clock signal MCK of the main counter 24 and the pulse signals PU, PD, and generates a mode switching signal CS from the lock detecting signal S4. The state detecting circuit 60 may control the lock detecting signal S4 in accordance with the internal state signal RS and clock signal RCK of the reference counter 22.

Figure 8:
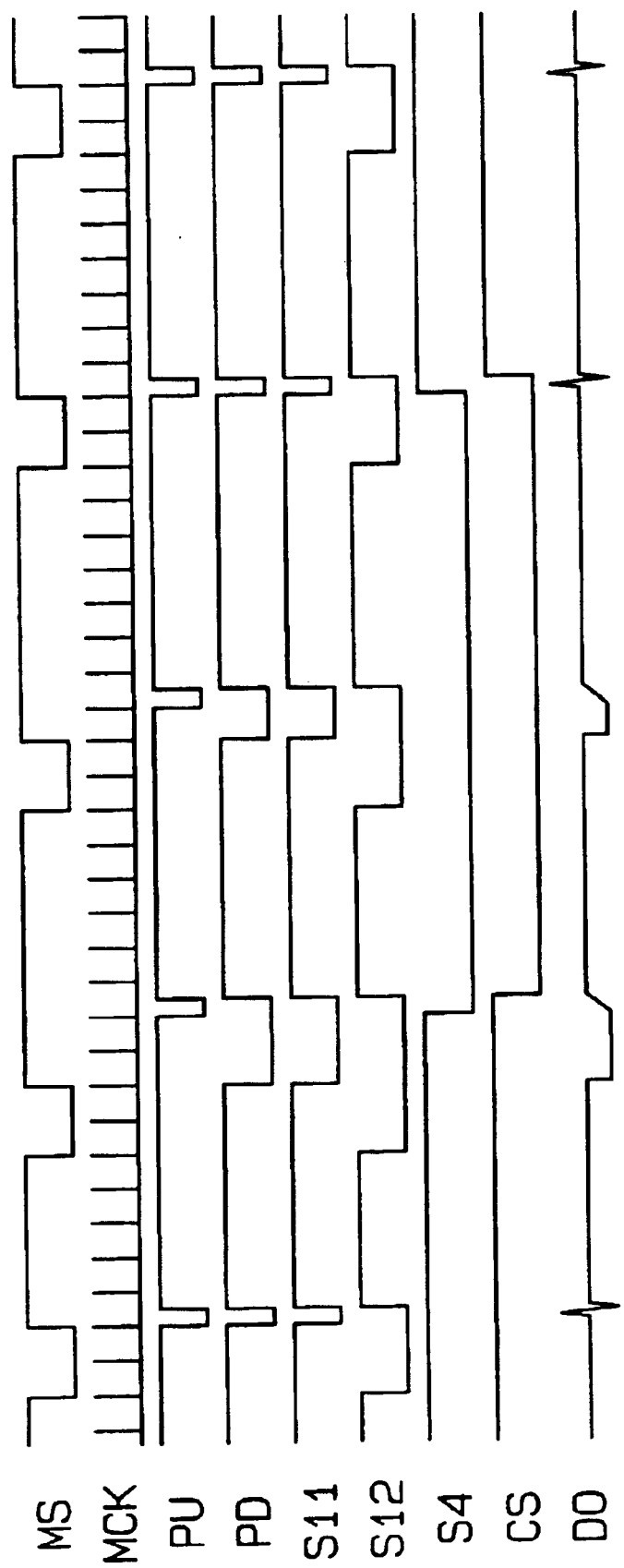
FIG. 8 is a timing chart of the PLL frequency synthesizer shown in FIG. 7.

Operation of a PLL frequency synthesizer 10A including the state detecting circuit 60 will be described below. As shown in FIG. 8, when the PLL circuit 20 is first operating in the normal mode, the lock detecting circuit 30 generates a lock detecting signal S4 of high level (locked state). In response to the lock detecting signal S4 of high level, the state detecting circuit 60 generates a mode switching signal CS of high level, which is supplied to the charge pump 25.

At this time, the locked frequency is changed and the phase difference between the pulse signals PU, PD from the phase comparator 23 increases beyond a predetermined value. Then, the lock detecting circuit 30 generates a lock detecting signal S4 of low level (unlocked state).

The state detecting circuit 60 responds to the lock detecting signal S4 of low level and latches the lock detecting signal S4 in accordance with a signal of low level supplied from the FF 61. Specifically, when the charge pump 25 is in the Z state, the state detecting circuit 60 generates a mode switching signal CS of low level. The PLL circuit 20 operates in the high-speed mode and locks up the VCO output signal at a high speed in response to the mode switching signal CS of low level.

Then, when the lock detecting circuit 30 generates a lock detecting signal S4 of high level again, which represents the locked state, the state detecting circuit 60 generates a mode switching signal CS of high level when the charge pump 25 is in the Z state. In response to the mode switching signal CS of high level, the PLL circuit 20 operates in the normal mode. Since the high-speed mode switches to the normal mode when the charge pump 25 is in the Z state, the unlocked frequency interval is reduced.

In the second embodiment, the internal state signal MS and clock signal MCK of the main counter 24 control the lock detecting signal S4. The state detecting circuit 60 offers the same advantages as those of the first embodiment, and may be made up of a reduced number of circuit components.

[Third Embodiment]

Figure 9:
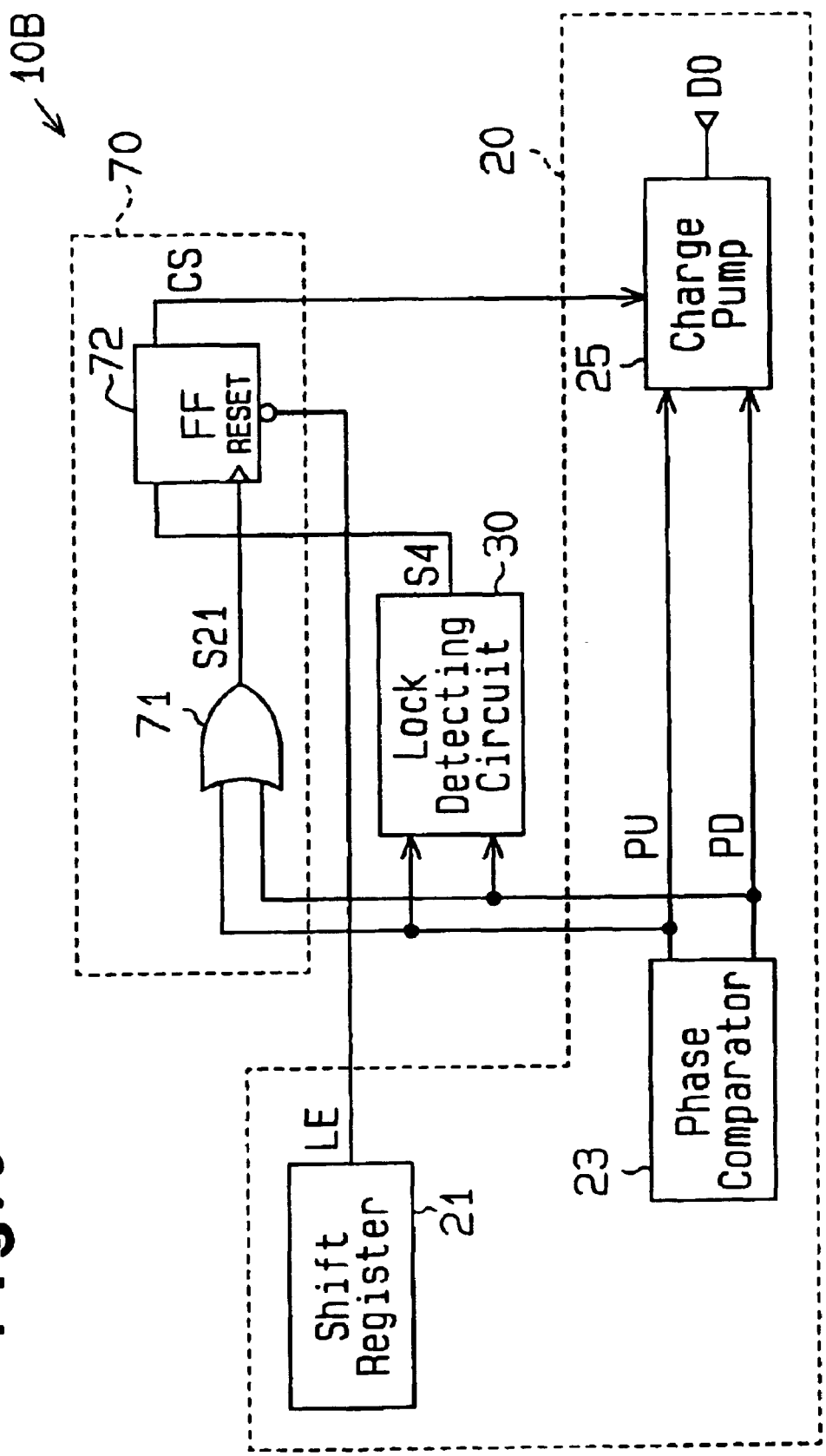
FIG. 9 is a schematic circuit diagram of a charge-pump Z-state detecting circuit of a PLL frequency synthesizer according to a third embodiment of the present invention.

FIG. 9 shows a schematic circuit diagram of a state detecting circuit 70 according to a third embodiment of the present invention.

The state detecting circuit 70 comprises an OR circuit 71 and a flip-flop (FF) 72.

The OR circuit 71 receives an up pulse signal PU and a down pulse signal PD. The FF 72 comprises a D flip-flop. The FF 72 has a clock input terminal which receives an output signal S21 from the OR circuit 71, a data input terminal which receives the lock detecting signal S4 from the lock detecting circuit 30, and a reset input terminal which receives a frequency-dividing ratio setting signal LE from a shift register 21. The FF 72 generates a mode switching signal CS. A frequency-dividing ratio of a counter for changing the locked frequency is established by the frequency-dividing ratio setting signal LE.

In the third embodiment, the state detecting circuit 70 controls the lock detecting signal S4 in accordance with the frequency-dividing ratio setting signal LE and the pulse signals PU, PD, and generates a mode switching signal CS, which is supplied to the charge pump 25.

When the high-speed mode is switched to the normal mode, the effect of an unlocked state is particularly large. Therefore, the state detecting circuit 70 according to the third embodiment controls mode switching primarily from the high-speed mode to the normal mode.

Figure 10:
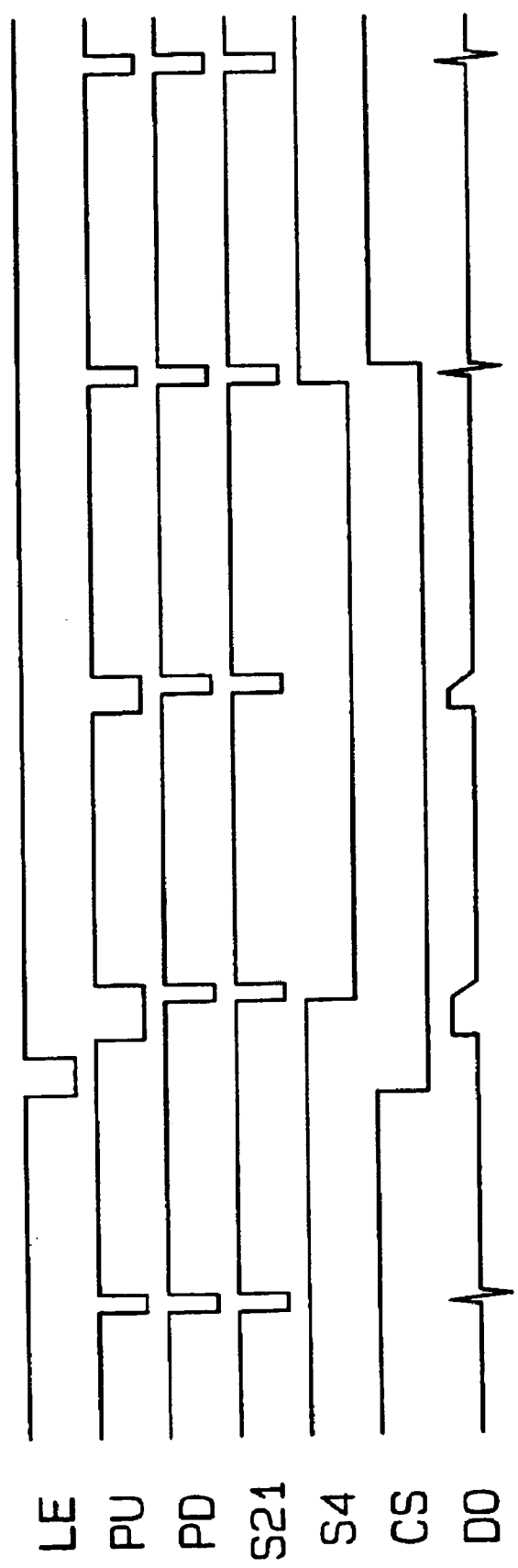
FIG. 10 is a timing chart of the PLL frequency synthesizer shown in FIG. 9.

Operation of a PLL frequency synthesizer 10B including the state detecting circuit 70 according to the third embodiment will be described below. As shown in FIG. 10, when the PLL circuit 20 is first operating in the normal mode, the lock detecting circuit 30 generates a lock detecting signal S4 of high level (locked state). In response to the lock detecting signal S4 of high level, the state detecting circuit 70 generates a mode switching signal CS of high level, which is supplied to the charge pump 25.

When the FF 72 receives a frequency-dividing ratio setting signal LE of low level from the shift register 21, the FF 72 generates a mode switching signal CS of low level in response to the frequency-dividing ratio setting signal LE of low level. The PLL circuit 20 operates in the high-speed mode in response to the mode switching signal CS of low level. The state detecting circuit 70 switches from the normal mode to the high-speed mode in accordance with the frequency-dividing ratio setting signal LE from the shift register 21.

Then, when the state detecting circuit 70 receives the lock detecting signal S4 of high level (locked state) again from the lock detecting circuit 30, the state detecting circuit 70 generates a mode switching signal CS of high level in response to the output signal S21 from the OR circuit 71. The PLL circuit 20 operates in the normal mode in response to the mode switching signal CS of high level.

As described above, the high-speed mode is switched to the normal mode by the output signal S21 from the OR circuit 71 which is input to the clock input terminal of the FF 72, and the mode switching signal CS is switched in synchronism with a rising edge of the output signal S21. Thus, the high-speed mode switches to the normal mode when the charge pump 25 is in the Z state.

The state detecting circuit 70 according to the third embodiment controls the lock detecting signal S4 in accordance with the frequency-dividing ratio setting signal LE from the shift register 21. The state detecting circuit 70 offers the same advantages as the first and second embodiments, and is made up of a smaller number of circuit components than the second embodiment.

It should be apparent to those skilled in the art that the present invention may be embodied in many other specific forms without departing from the spirit or scope of the invention. Particularly, it should be understood that the invention may be embodied in the following forms.

In the first and second embodiments, the internal state signals RS, MS (counter internal output signals) of the reference counter 22 and the main counter 24 may be signals one or three clock pulses prior to the reference frequency-divided signal LDR and the comparison frequency-divided signal LDP (counter output signals). To describe in more detail, the internal state signals RS, MS may be signals capable of reliably masking the operation of the charge pump 25 immediately prior to the reference frequency-divided signal LDR and the comparison frequency-divided signal LDP.

The phase comparator 23 or the LPF 26 may switch the mode from the high-speed mode to the normal mode. In this case, the phase comparator 23 switches the mode by changing the pulse duration of the up pulse signal PU or the down pulse signal PD in response to the mode switching signal CS. The LPF 26 switches the mode by changing the characteristics of the LPF 26 in response to the mode switching signal CS.

The state detecting circuits 40, 60, 70 may generate a mode switching signal CS in accordance with the frequency-dividing ratio setting signal LE from the shift register 21 rather than the lock detecting signal CS. Alternatively, the state detecting circuits 40, 60, 70 may generate a mode switching signal CS in accordance with a signal supplied from an external device to the PLL circuit 20.

As indicated by the dotted lines in FIG. 3, the state detecting circuit may include a delay circuit 45 for delaying the mode switching signal CS by a given time. The delay circuit 45 delays a level change of the mode switching signal CS by a set time (delay time) of the delay circuit 45 from a rising edge of the up pulse signal PU and the down pulse signal PD. That is, a level change of the mode switching signal CS is delayed by the delay time of the delay circuit 45 from the end of operation of the charge pump 25. Accordingly, the mode can be changed reliably when the output terminal of the charge pump 25 is in the Z state.

Therefore, the present examples and embodiments are to be considered as illustrative and not restrictive and the invention is not to be limited to the details given herein, but may be modified within the scope and equivalence of the appended claims.

What is claimed is:

1. A method of switching the mode of a PLL circuit, wherein the PLL circuit includes a phase comparator for comparing the phase of a reference frequency-divided signal and the phase of a comparison frequency-divided signal with each other and generating a comparison output signal, a charge pump for generating a current depending on the comparison output signal from the phase comparator, a voltage-controlled oscillator for generating an output signal having a predetermined frequency in accordance with the current generated by the charge pump, a lock detecting circuit for detecting a locked state of the PLL circuit in accordance with the comparison output signal from the phase comparator and generating a lock detecting signal when the locked state is detected, and a shift register for generating a frequency-dividing ratio setting signal for changing a frequency-dividing ratio used to generate at least one of the reference frequency-divided signal and the comparison frequency-divided signal, and wherein the PLL circuit has a first mode for locking an output signal thereof up to a desired frequency at a high speed and a second mode in normal use, the method comprising the steps of:
    detecting a high impedance state of the charge pump;
    controlling the lock detecting signal using the frequency-dividing ratio setting signal to generate a mode switching signal in accordance with the controlled lock detecting signal; and
    switching the mode of the PLL circuit from the first mode to the second mode or from the second mode to the first mode in response to the mode switching signal when the high impedance state is detected.

2. The method of switching the mode of a PLL circuit according to claim 1, wherein the PLL circuit further includes a reference counter connected to the phase comparator, for generating the reference frequency-divided signal, a clock signal, and an internal state signal in accordance with the frequency-dividing radio setting signal, and a main counter connected to the phase comparator, for generating the comparison frequency-divided signal, a clock signal, and an internal state signal in accordance with the frequncy-dividing ratio setting signal,
    wherein said controlling step includes controlling the lock detecting signal using the comparison output signal from the phase comparator and the clock signal and the internal state signal of either one of the reference counter and the main counter to generate a mode switching signal in accordance with the controlled lock detecting signal.

3. The method of switching the mode of a PLL circuit according to claim 1, wherein the PLL circuit further includes a reference counter connected to the phase comparator, for generating the reference frequency-divided signal in accordance with the frequency-dividing ratio setting signal, and a main counter connected to the phase comparator, for generating the comparison frequency-divided signal in accordance with the frequency-dividing ratio setting signal,
    wherein said controlling step includes controlling the lock detecting signal using the comparison output signal from the phase comparator and the frequency-dividing ratio setting signal to generate the mode switching signal in accordance with the controlled lock detecting signal.

4. A circuit for controlling the mode of a PLL circuit, wherein the PLL circuit includes a phase comparator for comparing the phase of a reference frequency-divided signal and the phase of a comparison frequency-divided signal with each other and generating a comparison output signal, a charge pump connected to the phase comparator, for generating a current depending on the comparison output signal from the phase comparator, a voltage-controlled oscillator connected to the charge pump, for generating an output signal having a predetermined frequency in accordance with the current generated by the charge pump and a shift register for generating a frequency-dividing ratio setting signal for changing a frequency-dividing ratio used to generate at least one of the reference frequency-divided signal and the comparison frequency-divided signal, and wherein the PLL circuit has a first mode for locking an output signal thereof up to a desired frequency at a high speed and a second mode in normal use, the circuit comprising:
    a lock detecting circuit for detecting a locked state of the PLL circuit in accordance with the comparison output signal from the phase comparator and generating a lock detecting signal when the locked state is detected; and
    a state detecting circuit connected to the lock detecting circuit, for detecting a high impedance state of the charge pump, and controlling the lock detecting signal using the frequency-dividing ration setting signal to generate a mode switching signal to switch the mode of the PLL circuit from the first mode to the second mode or from the second mode to the first mode when the high impedance state is detected.

5. The circuit for controlling the mode of a PLL circuit according to claim 4, wherein the PLL circuit includes a reference counter connected to the phase comparator, for generating the reference frequency-divided signal, a clock signal, and an internal state signal in accordance with the frequency-dividing ratio setting signal, and a main counter connected to the phase comparator, for generating the comparison frequency-divided signal, a clock signal, and an internal state signal in accordance with the frequency-dividing ratio setting signal; and wherein the state detecting circuit controls the lock detecting signal using the comparison output signal from the phase comparator and the clock signal and the internal state signal of either one of the reference counter and the main counter, and generates the mode switching signal in accordance with the controlled lock detecting signal.

6. The circuit for controlling the mode of a PLL circuit according to claim 5, wherein the phase comparator compares the phase of the reference frequency-divided signal and the phase of the comparison frequency-divided signal with each other and generates a first pulse signal and a second pulse signal, and wherein the state detecting circuit includes:

a first flip-flop for generating a first flip-flop output signal, the first flip-flop having a first clock input terminal for receiving the clock signal from the reference counter, a first data input terminal for receiving the internal state signal from the reference counter, and a first reset input terminal for receiving the first pulse signal from the phase comparator;

a second flip-flop for generating a second flip-flop output signal, the second flip-flop having a second clock input terminal for receiving the clock signal from the main counter, a second data input terminal for receiving the internal state signal from the main counter, and a second reset input terminal for receiving the second pulse signal from the phase comparator;

an AND circuit connected to the first and second flip-flops, for receiving the first and second flip-flop output signals and generating an AND output signal; and a latch circuit connected to the AND circuit and the lock detecting circuit, for latching the lock detecting signal in accordance with the AND output signal and generating the mode switching signal.

7. The circuit for controlling the mode of a PLL circuit according to claim 6, wherein each of the first and second flip-flops includes a D flip-flop.

8. The circuit for controlling the mode of a PLL circuit according to claim 5, wherein the reference counter generates the internal state signal thereof a predetermined number of clock pulses prior to the reference frequency-divided signal, and wherein the main counter generates the internal state signal thereof a predetermined number of clock pulses prior to the comparison frequency-divided signal.

9. The circuit for controlling the mode of a PLL circuit according to claim 5, wherein the state detecting circuit includes:

an AND circuit connected to the phase comparator, for receiving the first pulse signal and the second pulse signal and generating an AND output signal;

a flip-flop connected to the AND circuit, for generating a flip-flop output signal, the flip-flop having a clock input terminal for receiving the clock signal from the main counter, a data input terminal for receiving the internal state signal from the main counter, and a reset input terminal for receiving the AND output signal; and a latch circuit connected to the flip-flop and the lock detecting circuit, for latching the lock detecting signal in accordance with the flip-flop output signal and generating the mode switching signal.

10. The circuit for controlling the mode of a PLL circuit according to claim 9, wherein the flip-flop includes a D flip-flop.

11. The circuit for controlling the mode of a PLL circuit according to claim 5, wherein the state detecting circuit includes:

an AND circuit connected to the phase comparator, for receiving the first pulse signal and the second pulse signal and generating an AND output signal;

a flip-flop connected to the AND circuit, for generating a flip-flop output signal, the flip-flop having a clock input terminal for receiving the clock signal from the reference counter, a data input terminal for receiving the internal state signal from the reference counter, and a reset input terminal for receiving the AND output signal; and a latch circuit connected to the flip-flop and the lock detecting circuit, for latching the lock detecting signal in accordance with the flip-flop output signal and generating the mode switching signal.

12. The circuit for controlling the mode of a PLL circuit according to claim 11, wherein the flip-flop includes a D flip-flop.

13. The circuit for controlling the mode of a PLL circuit according to claim 4, wherein the PLL circuit includes a reference counter for generating the reference frequency-divided signal in accordance with the frequency-dividing ratio setting signal, and a main counter for generating the comparison frequency-divided signal in accordance with the frequency-dividing ratio setting signal, and wherein the state detecting circuit controls the lock detecting signal using the comparison output signal from the phase comparator and the frequency-dividing ratio setting signal, and generates the mode switching signal in accordance with the controlled lock detecting signal.

14. The circuit for controlling the mode of a PLL circuit according to claim 13, wherein the state detecting circuit includes:

an OR circuit connected to the phase comparator, for receiving the first pulse signal and the second pulse signal, and generating an OR output signal; and a flip-flop connected to the OR circuit and the lock detecting circuit, for generating the mode switching signal, the flip-flop having a clock input terminal for receiving the OR output signal and a data input terminal for receiving the lock detecting signal, and a reset input terminal for receiving the frequency-dividing ratio setting signal.

15. The circuit for controlling the mode of a PLL circuit according to claim 14, wherein the flip-flop includes a D flip-flop.

16. The circuit for controlling the mode of a PLL circuit according to claim 4, wherein the state detecting circuit further includes:

a delay circuit for delaying the mode switching signal by a predetermined time.

17. The circuit for controlling the mode of a PLL circuit according to claim 4, wherein the PLL circuit further includes a low-pass filter connected to the charge pump, for smoothing an output signal from the charge pump to remove high-frequency components therefrom, and supplying the output signal from the charge pump, from which the high-frequency components have been removed, to the voltage-controlled oscillator, and wherein the state detecting circuit supplies the mode switching signal to the charge pump.

18. A semiconductor device comprising:

a PLL circuit;

a lock detecting circuit for detecting a locked state of the PLL circuit and generating a lock detecting signal when the locked state is detected; and a mode control circuit connected to the PLL circuit, for controlling switching of the mode of the PLL circuit; wherein the PLL circuit includes:

a phase comparator for comparing the phase of a reference frequency-divided signal and the phase of a comparison frequency-divided signal with each other and generating a comparison output signal, a charge pump connected to the phase comparator, for generating a current depending on the result of the comparison by the phase comparator, a voltage-controlled oscillator connected to the charge pump, for generating an output signal having a predetermined frequency in accordance with the current generated by the charge pump, wherein the PLL circuit has a first mode for locking an output signal thereof up to a desired frequency at a high speed and a second mode in normal use; and a shift register for generating a frequency-dividing ratio setting signal for changing a frequency-dividing ratio used to generate at least one of the reference frequency-divided signal and the comparison frequency-divided signal; and wherein the mode control circuit detects a high impedance state of the charge pump, and controls the lock detecting signal using the frequency-dividing ratio setting signal to generate a mode switching signal to switch the mode of the PLL circuit from the first mode to the second mode or from the second mode to the first mode when the high impedance state is detected.

\* \* \* \* \*